(12) United States Patent
Iimura et al.

(10) Patent No.: US 8,338,234 B2
(45) Date of Patent: Dec. 25, 2012

(54) HYBRID INTEGRATED CIRCUIT DEVICE AND MANUFACTURING METHOD THEREOF

(75) Inventors: Junichi Iimura, Gunma (JP); Yasuhiro Koike, Gunma (JP); Soichi Izutani, Gunma (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 335 days.

(21) Appl. No.: 12/182,519

(22) Filed: Jul. 30, 2008

(65) Prior Publication Data

US 2009/0011548 A1    Jan. 8, 2009

Related U.S. Application Data

(62) Division of application No. 10/907,338, filed on Mar. 29, 2005, now abandoned.

(30) Foreign Application Priority Data

Mar. 29, 2004 (JP) ................................. 2004-094685

(51) Int. Cl.
*H01L 21/00* (2006.01)
(52) U.S. Cl. ........ 438/111; 257/673; 257/692; 257/772; 257/E23.031; 257/E23.066; 257/E25.031; 438/114; 438/119; 438/125
(58) Field of Classification Search .......... 438/112–114, 438/119, 123, 111, 125; 257/672, 772, E23.052, 257/673, 692, E23.031, E23.066, E25.031
See application file for complete search history.

(56) References Cited

U.S. PATENT DOCUMENTS

| | | | |
|---|---|---|---|
| 4,501,154 A | 2/1985 | Mori | |
| 5,825,081 A | 10/1998 | Hosomi et al. | |
| 6,224,392 B1 * | 5/2001 | Fasano et al. | 439/66 |
| 6,462,427 B2 | 10/2002 | Sakiyama et al. | |
| 6,593,169 B2 | 7/2003 | Iimura et al. | |
| 6,713,850 B1 | 3/2004 | Yuan et al. | |
| 2001/0042906 A1 * | 11/2001 | Nakamura et al. | 257/668 |
| 2002/0163068 A1 | 11/2002 | Asada | |
| 2003/0001255 A1 | 1/2003 | Iimura et al. | |
| 2004/0006869 A1 * | 1/2004 | Igarashi et al. | 29/847 |

FOREIGN PATENT DOCUMENTS

| | | |
|---|---|---|
| CN | 1395308 A | 5/2003 |
| EP | 0 758 798 | * 2/1997 |
| JP | 06-177295 | 6/1994 |
| KR | A-1998-078348 | 11/1998 |

OTHER PUBLICATIONS

Chinese Office Action dated Jun. 15, 2007 (2 pp).
Korean Office Action, dated Jul. 28, 2006 (2 pp).
Taiwanese Office Action, dated Nov. 22, 2006 (6 pp).

* cited by examiner

*Primary Examiner* — John C Ingham
(74) *Attorney, Agent, or Firm* — Westerman, Hattori, Daniels & Adrian, LLP

(57) ABSTRACT

A method of manufacturing a hybrid integrated circuit device of the present invention includes the steps of preparing a lead frame which constituted by units each having a plurality of leads, and fixing a circuit substrate on each unit of the lead frame by fixing pads which are formed on the surface of the circuit substrate to the leads, where a space between a first pad which is formed at an end edge of the circuit substrate and a second pad which is adjacent to the first pad is set narrower than a space between the pads themselves.

11 Claims, 13 Drawing Sheets

HYBRID INTEGRATED CIRCUIT DEVICE AND MANUFACTURING METHOD THEREOF

BACKGROUND OF THE INVENTION

Priority is claimed to Japanese Patent Application Number JP2004-094685 filed on Mar. 29, 2004, the disclosure of which is incorporated herein by reference in its entirety.

FIELD OF THE INVENTION

The present invention relates to a hybrid integrated circuit device and a method of manufacturing the same, more particularly to a hybrid integrated circuit device having leads functioning as external terminals and a method of manufacturing the same.

DESCRIPTION OF THE RELATED ART

A known method of manufacturing a hybrid integrated circuit device is described with reference to FIGS. 12A to 14.

First, with reference to FIGS. 12A and 12B, described is the step of cutting a large size metal substrate 116A into narrow strips. FIG. 12A is a plan view of a large size metal substrate 116A and FIG. 12B is a cross-sectional view of the large size metal substrate 116A.

The large size metal substrate 116A is cut into narrow strips along dicing lines D10 shown in FIG. 12A. This cutting is performed by shearing with a shear force. Each narrow-cut metal substrate may be further cut into two or more sections considering workability in a later step such as a bonding step. Here in this case, the narrow-cut metal substrate is to be cut into two metal substrates 116B having different lengths.

With reference to FIG. 12B, a constitution of the metal substrate 116A is described. In this case, the substrate 116A is a substrate made of aluminum. The both sides thereof are anodized. Moreover, on one side of the metal substrate 116A on which hybrid integrated circuits will be formed, an insulating layer 107 is disposed to provide insulation between the metal substrate 116A and conductive patterns. Thereafter, on an upper side of the insulating layer 107, copper foil 118 is provided which is to be formed in conductive patterns.

With reference to FIGS. 13A and 13B, description will be given on the step of forming hybrid integrated circuits 117 on the surface of the narrow-cut metal substrate 116B. FIG. 13A is a plan view of the narrow-cut metal substrate 116B on which the plurality of hybrid integrated circuits 117 are formed, and FIG. 13B is a cross-sectional view thereof.

First, conductive patterns 108 are formed by etching the copper foil which is attached by pressure to the surface of the insulating layer 107. Here, the patterning of the conductive patterns 108 is performed such that a plurality of hybrid integrated circuits are formed on the narrow metal substrate 116B. Furthermore, pads 108A on which leads are fixed in a later step are formed to align in order.

Next, by use of brazing material such as soft solder, circuit elements 104 are fixed on predetermined locations on the conductive pattern 108. As for the circuit elements 104, passive elements and active elements can generally be adopted. Further, in the case of mounting a power element, the element is mounted on a heatsink which is fixed on the conductive pattern.

With reference to FIG. 14 a method of separately cutting the metal substrate 116B, on which the plurality of hybrid integrated circuits 117, into individual circuit substrates 106 is described. Each circuit substrate 106, on the surface of which the hybrid integrated circuit 117 is formed, is cut separately from the metal substrate 116B by punching out a portion of the circuit substrate 106 using a press machine. Here, the press machine punches the metal substrate 116B from the surface on the side on which the hybrid integrated circuits 117 are formed. Because of this, the periphery of the circuit substrate 106 has been left over as a margin on which no conductive patterns and circuit elements are formed.

The circuit substrate 106, which is separately cut through the process described above, is finished as a product after passing through the steps of sealing the hybrid integrated circuit 117 and the like. This technology is described for instance in Japanese Patent Application Publication No. Hei 6(1994)-177295 (page 4, FIG. 1).

However, the hybrid integrated circuit device manufactured by the known manufacturing method described above has the problem of reduced reliability in connections between pads 108A arranged in the periphery and leads which are to be connected to the pads 108A. The reason behind this is that there is a case that a pad 108A arranged at an end edge of the substrate 106 is arranged far apart from other pads 108A. Under this condition, when a hybrid integrated circuit device is mounted using leads fixed to the pad 108A, a large stress is exerted on the joint portion of the leads and the pads 108A arranged at the end edge of the substrate 106.

Furthermore, in the manufacturing method described above the punching process causes the individual circuit substrates 106 to be separated in various scattered positions. Thus the handling of the individual circuit substrates becomes complicated in later steps. Specifically, it is necessary to place each circuit substrate in a molding die separately in a sealing step, and thus there is a problem of handling in setting a position of each circuit substrate every time.

SUMMARY OF THE INVENTION

The present invention provides a method of manufacturing a hybrid integrated circuit device, in which it is possible to perform sealing after fixing a plurality of circuit substrates on a lead frame.

A hybrid integrated circuit device of the present invention includes: a circuit substrate; a plurality of pads arranged along a side surface of the circuit substrate; and leads fixed to the pads, wherein a space between a first pad which is formed at an end edge of the circuit substrate and a second pad which is adjacent to the first pad is set narrower than a space between the other pads themselves.

Further, in the hybrid integrated circuit device of the present invention, the pads and the leads are fixed to each other with soft solder.

Still further, in the hybrid integrated circuit device of the present invention, any one of the first and second pads is a dummy pad.

A method of manufacturing a hybrid integrated circuit of the present invention includes: the steps of: preparing a lead frame which is constituted by units each having a plurality of leads; and fixing a circuit substrate on each unit of the lead frame by fixing pads formed on a surface of the circuit substrate to the leads, wherein a space between a first pad which is formed at an end edge of the circuit substrate and a second pad which is adjacent to the first pad is set narrower than a space between the other pads themselves.

Further, in the method of manufacturing the hybrid integrated circuit of the present invention, the pads are arranged along a side edge of the circuit substrate.

Further, in the method of manufacturing the hybrid integrated circuit of the present invention, the pads are arranged along opposite side edges of the circuit substrate.

Further, in the method of manufacturing the hybrid integrated circuit of the present invention, any one of the first and second pads is a dummy pad.

Further, in the method of manufacturing the hybrid integrated circuit of the present invention, the fixing of the leads and the pads to each other is performed with brazing material.

Further, in the method of manufacturing the hybrid integrated circuit of the present invention, the circuit substrate is fixed on the lead frame after forming an electric circuit constituted by a conductive pattern and a circuit element on the surface of the circuit substrate.

Further, in the method of manufacturing the hybrid integrated circuit of the present invention, an electric circuit formed on the surface of the circuit substrate is sealed after fixing the circuit substrate on the lead frame.

In the hybrid integrated circuit device of the present invention and the method of manufacturing the same, a space between a first pad located at an end edge and a second pad which is adjacent to the first pad is made narrower than the space between other pads themselves. Therefore, thermal stress, in a course of the manufacturing process and under the state of usage, acting on the first pad which is located at the end edge can be reduced, and thus reliability in connections between pads and leads can be improved.

Further, in the method of manufacturing the hybrid integrated circuit device of the present invention, after circuit substrates having electric circuits formed on the surfaces thereof are separated, the subsequent steps can be performed under the circumstances that a plurality of circuit substrates are fixed to a lead frame. Therefore, it is possible to perform the steps of sealing with resin and the like, under the physically constricted states of the circuit substrates on the lead frame. With this constitution, time necessitated for handling for physical transportation of the circuit substrates and positioning thereof can be reduced.

DETAILED DESCRIPTION OF THE PREFERRED EMBODIMENTS

Figure 1A:
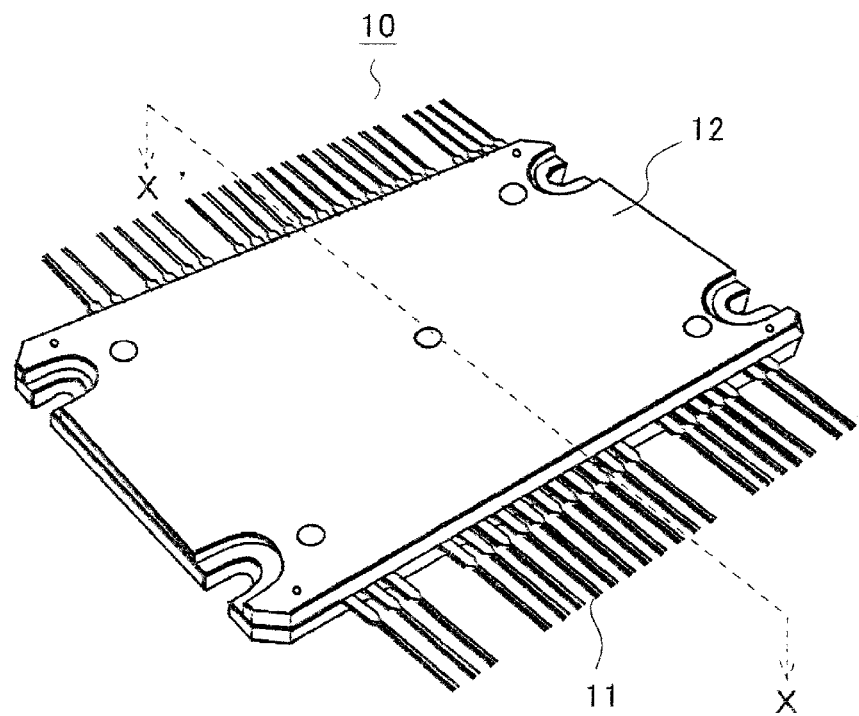
FIGS. 1A and 1B are a perspective view and a cross-sectional view of a hybrid integrated circuit device according to a preferred embodiment of the present invention, respectively.
Figure 1B:
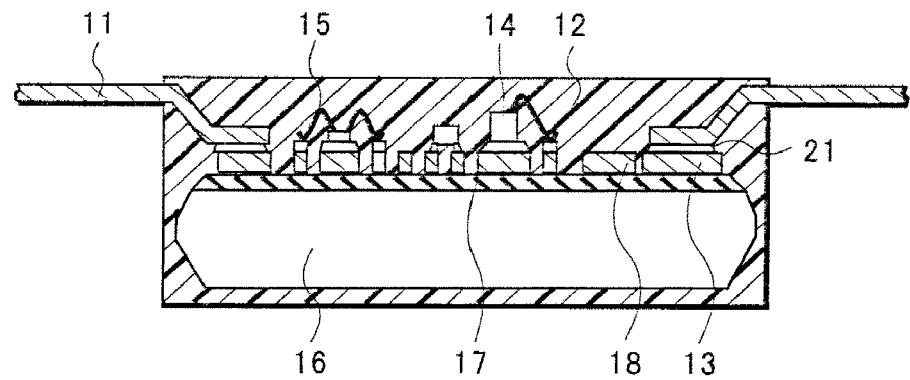

With reference to FIGS. 1A and 1B, a configuration of a hybrid integrated circuit device 10 according to a preferred embodiment of the present invention is described. FIG. 1A is a perspective view of the hybrid integrated circuit device 10, and FIG. 1B is a cross-sectional view taken along the X-X' line of FIG. 1A.

The hybrid integrated circuit device 10 of the preferred embodiment includes a circuit substrate 16 on which an electric circuit having a conductive pattern 18 and circuit elements 14 is formed, and sealing resin 12 which seals this electric circuit and covers at least the surface of the circuit substrate 16. Each configuration element shown above is hereafter described.

The circuit substrate 16 is a substrate made of metal such as aluminum or copper. As an example, when a substrate made of aluminum is adopted as the circuit substrate 16, there are two methods for providing insulation between the circuit substrate 16 and the conductive pattern 18 formed thereon. One method is to anodize the surface of the aluminum substrate. The other is to form an insulating layer 17 on the surface of the aluminum substrate and then to form the conductive patterns 18 on the top surface of the insulating layer 17. In order to efficiently dissipate heat generated by the circuit elements 14 disposed on the surface of the circuit substrate 16 to the outside, the back side of the circuit substrate 16 may be exposed from the sealing resin 12 to the outside. Furthermore, in order to improve moisture resistance of the entire device it is also possible to seal the entity as a whole with the sealing resin 12 including the back side surface of the circuit substrate 16.

Further, the side surfaces of the circuit substrate 16 have shapes having inclined portions protruding toward the outside. Having provided with the inclined portions on the side surfaces of the circuit substrate 16 as described above, adhesion strength between the side surface of the circuit substrate 16 and the sealing resin 12 can be improved.

The circuit elements 14 are fixed on the conductive patterns 18, and a predetermined electric circuit is constituted by the circuit elements 14 and the conductive patterns 18. As for the circuit elements 14, active elements such as transistors and diodes, and passive elements such capacitors and resistors are to be adopted. Moreover, as for power semiconductor elements and the like which generate large amounts of heat, the elements may be fixed to the circuit substrate 16 with a metal heatsink interposed therebetween. Here, active elements and the like which are mounted with their faces upward are electrically connected to the conductive patterns 18 through thin metal wires 15.

The conductive pattern 18 is made of metal such as copper and is formed in insulation with the circuit substrate 16. In addition, pads 13 are formed as part of the conductive patterns 18 at sides from which leads 11 protrude. In this configuration, a plurality of pads 13 aligned are provided in the vicinities of two opposite sides of the circuit substrate 16. Further, the conductive pattern 18 adheres to the surface of the circuit substrate 16 by using the insulating layer 17 as an adhesive.

In this embodiment, a space between a first pad located at an end edge and a second pad adjacent to the first pad is made narrower than the space between two of the other pads. By doing so, stress acting on the joint of a lead 11 and a pad located at the end edge has been reduced. The details of the first pad and the like are described later with reference to FIG. 9.

The leads 11 are fixed to the pads 13 which are provided in the periphery of the circuit substrate 16, and provide functionality of input/output with the outside, for example. In this embodiment, a plural number of leads 11 are provided in two opposite edge portions using soft solder 21. Adhesion of the leads 11 and the pads 13 is performed using a conductive type adhesive material such as soft solder (brazing material). It is also possible to allow the leads 11 to protrude from only one side edge. Furthermore, it is also possible to allow the leads 11 to protrude from four side edges.

The sealing resin 12 is formed by transfer molding using thermosetting resin or by injection molding using thermoplastic resin. Here, in this embodiment, the sealing resin 12 is formed so that the circuit substrate 16 and the electric circuit formed on the surface thereof are sealed, and the whole entity including the back side surface of the circuit substrate 16 is sealed with the sealing resin 12. Meantime, there are also cases where the back side of the circuit substrate 16 is exposed to the outside from the sealing resin 12 in order to improve heat dissipation.

Figure 2A:
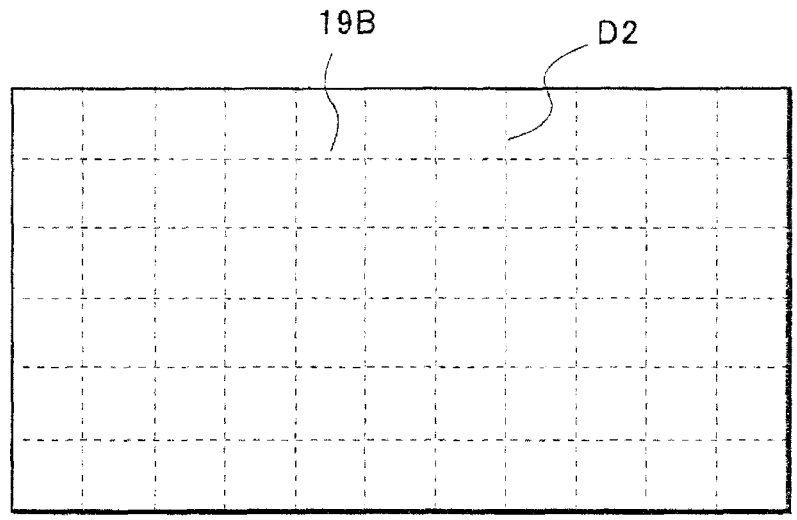
FIGS. 2A to 2C are a plan view, a perspective view, and an enlarged view showing a method of manufacturing the hybrid integrated circuit device of the preferred embodiment, respectively.
Figure 2B:
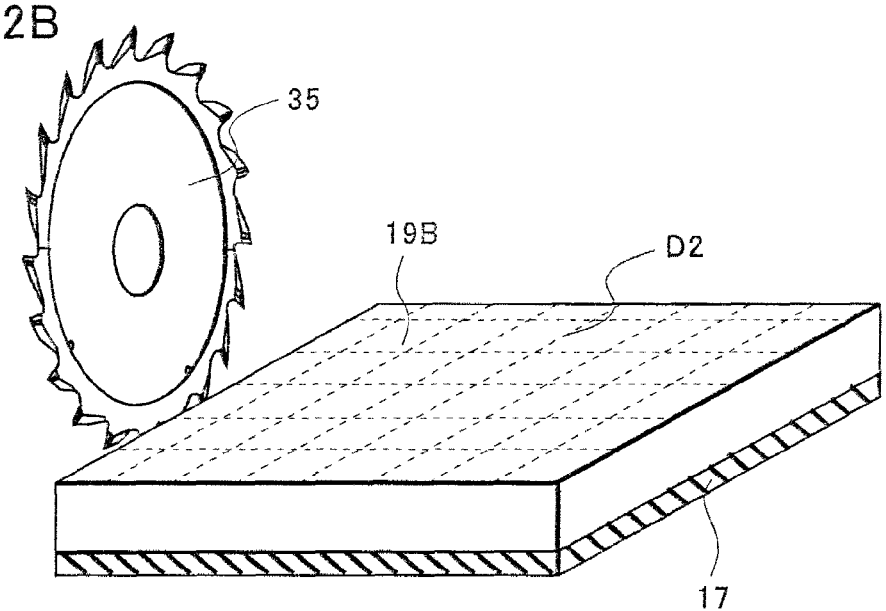
Figure 2C:
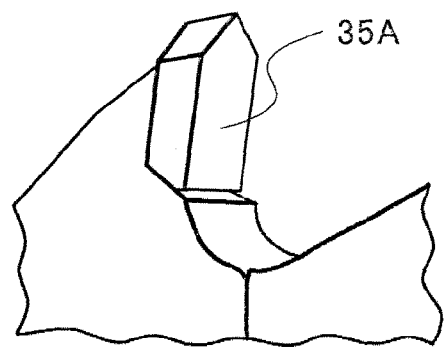

With reference to FIGS. 2A to 2C and the rest of the figures, a method of manufacturing the hybrid integrated circuit device is described. The manufacturing method according to an embodiment of the present invention includes the steps of preparing a lead frame 50 constituted by units 51 having a plurality of leads 11, and fixing circuit substrate 16 on each unit 51 of the lead frame 50 by firmly fixing the leads 11 to the pads 13 which are formed on the surface of the circuit substrate 16. In this manufacturing method, a space between a first pad 13A formed at an end edge of the circuit substrate 16 and a second pad 13B adjacent to the first pad 13A is set narrower than the space between the other pads, thus manufacturing the hybrid integrated circuit device. The details of each step described above will be described hereinafter.

<First Step>: Refer to FIGS. 2A to 3B

In this step, conductive patterns 18 are formed on the surface of a large size metal substrate 19B, and grooves 20 are formed at the boundaries of the conductive patterns 18. FIGS. 2A to 2C are a plan view of the metal substrate 19B, a perspective view indicating a state of forming the grooves in the metal substrate 19B by using a V-cut saw 35, and an enlarged view of a blade edge 35A, respectively.

First by referring to FIG. 2A the metal substrate 19B of an intended size is prepared. To the surface of this metal substrate 19B, conductive foil is attached by pressure with an insulating layer interposed therebetween. The plurality of conductive patterns 18 are formed by patterning this conductive foil in intended shapes. The number of conductive patterns 18 formed may depend on the size of the metal substrate 19B and that of the hybrid integrated circuit, but conductive patterns which form about several tens to several hundreds of hybrid integrated circuits can be formed on one sheet of the metal substrate 19B.

Next, in both of front and rear surfaces of the metal substrate 19B first grooves 20A and second grooves 20B are formed in a lattice shape. As shown in FIG. 2B, by rotating a V-cut saw 35 at a high speed, the first grooves 20A and the second grooves 20B are formed in the front and rear surfaces of the metal substrate along dicing lines D2. The dicing lines D2 are arranged in a lattice shape.

With reference to FIG. 2C, a shape of the V-cut saw 35 is described. The multiple number of blade edges 35A having a shape as shown in FIG. 2C are disposed on the V-cut saw 35. Here, the shape of the blade edge 35A corresponds to the shape of the grooves formed in the metal substrate 19B. In this case grooves having a V-shape in the cross-section are formed in both sides of the metal substrate. Accordingly, the shape of the blade edge 35A is also V-shaped. Note that diamond is embedded in the blade edge 35A.

Figure 3A:
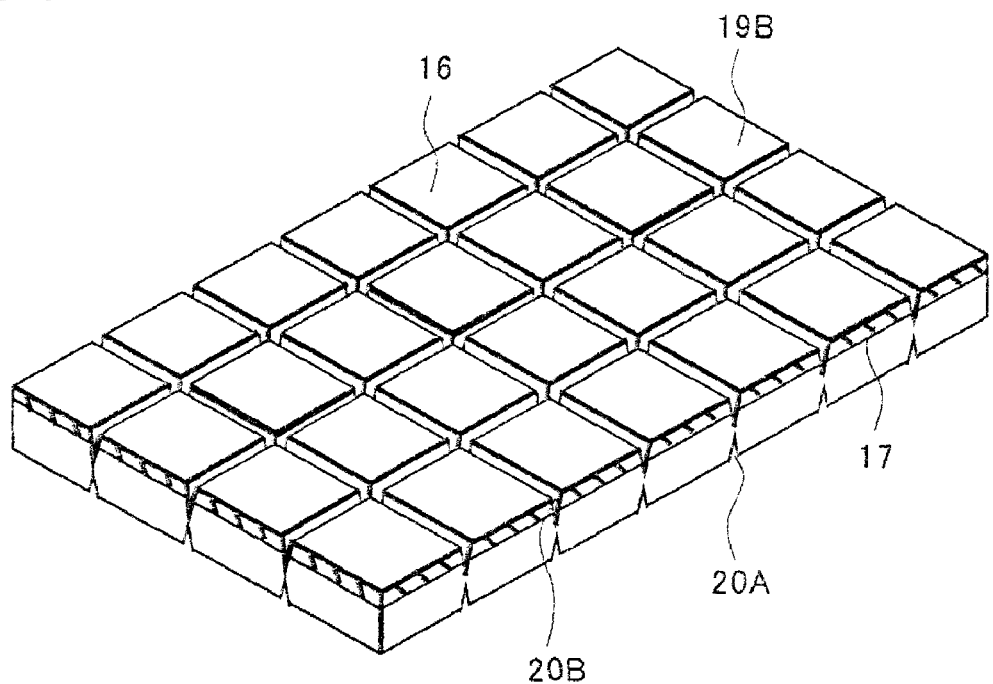
FIGS. 3A and 3B are a perspective view and a cross-sectional view showing the method of manufacturing the hybrid integrated circuit device of the preferred embodiment, respectively.
Figure 3B:
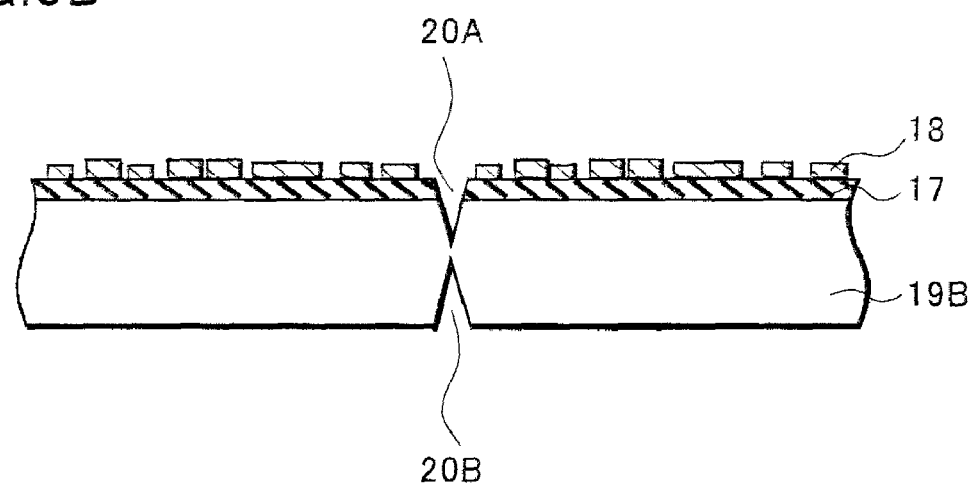

Next, with reference to FIGS. 3A and 3B, a shape of the metal substrate 19B in which the grooves 20 are formed is described. FIG. 3A is a perspective view of the metal substrate 19B in which the grooves 20 are formed by the cut saw 35, and FIG. 3B is a cross-sectional view of the metal substrate 19B.

As shown in FIG. 3A, in both front and rear surfaces of the metal substrate 19B, the first grooves 20A and the second grooves 20B are formed in a lattice shape. Here, the two dimensional positions of the first grooves 20A and the second grooves 20B correspond to each other. In this embodiment, the grooves 20 have a V-shaped cross section, since the grooves are formed with a V-cut saw 35 having the V-shaped blade edges 35A. The center lines of the grooves 20 correspond to the boundaries of each of the conductive patterns 18 which is formed on an insulating layer 17. Here, the first grooves 20A are formed in the surface on which a resin layer 17 is deposited, and on the other side the second grooves 20B are formed.

With reference to FIG. 3B, the shape and the like of the grooves 20 are described. Here, the grooves 20 are formed roughly in a V-shape cross-section. The depths of the first and second grooves 20A and 20B are shallower than a half thickness of the metal substrate 19B. Accordingly, the individual circuit substrates 16 are not separated in this step. In other words, the circuit substrates 16 are connected to each other with the remaining-thickness portions of the metal substrate 19B which correspond to the portions of the grooves 20. Therefore, until the metal substrate 19B is cut and separated into the individual circuit substrates 16, the metal substrate 19B can be treated as a sheet.

In this process, the depth and width of the first and second grooves 20A and 20B can be adjusted. Specifically, by narrowing the aperture angle of the first grooves 20A, it is possible to widen the effective area on which the conductive patterns 18 can be formed. In addition the same effect can be achieved by forming the depth of the first grooves 20A shallower.

The size of the first grooves 20A and that of the second grooves 20B can also be set equal to each other. This makes it possible to prevent warping from occurring in the metal substrate 16B in which the grooves 20 are formed in a lattice shape.

Figure 4A:
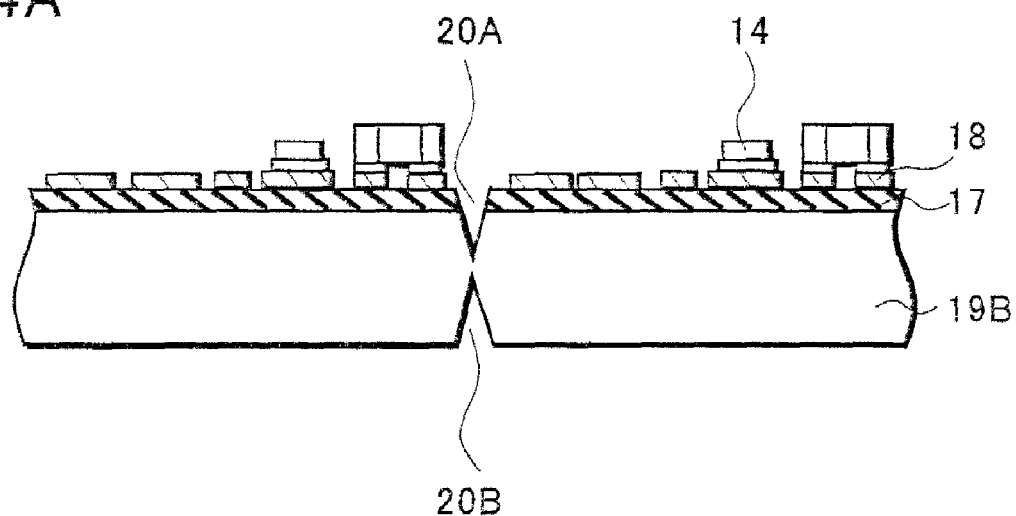
FIGS. 4A and 4B are a cross-sectional view and also a cross-sectional view showing the method of manufacturing the hybrid integrated circuit device of the preferred embodiment, respectively.
Figure 4B:
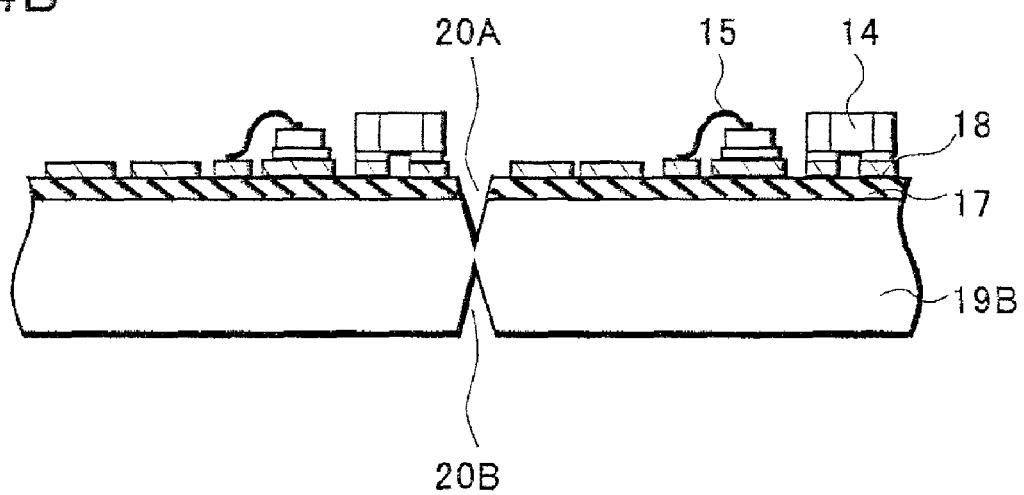
Figure 5:
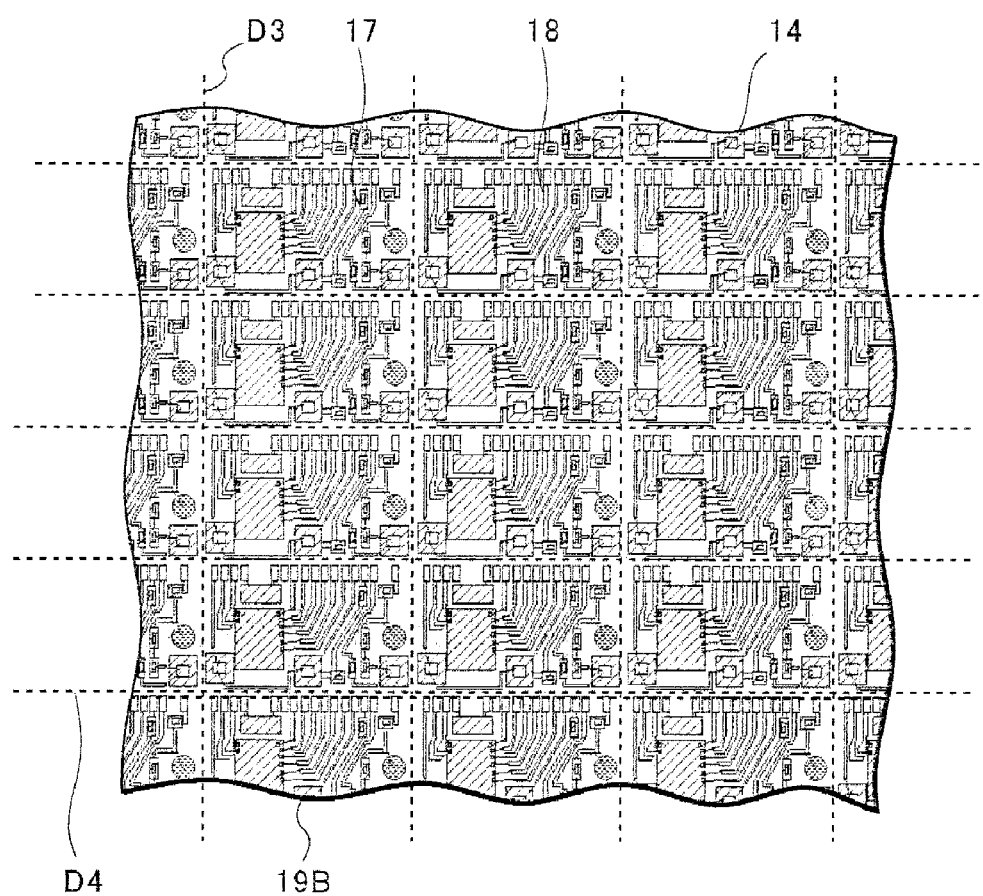
FIG. 5 is a plan view showing the method of manufacturing the hybrid integrated circuit device of the preferred embodiment.

<Second Step>: Refer to FIGS. 4A to 5

In this step, the circuit elements 14 are mounted on the conductive patterns 18, and electrical connections between the circuit elements 14 and the conductive patterns 18 are performed.

First, as shown in FIG. 4A, the circuit elements 14 are mounted on predetermined positions of the conductive patterns 18 using brazing material such as soft solder. As for the circuit elements 14, active elements such as transistors and diodes, and passive elements such as capacitors and resistors can be adopted. Moreover, as for power semiconductor elements which generate large amounts of heat, the elements may be fixed on the circuit substrate 16 with a metal heatsink interposed therebetween. With reference to FIG. 4B, active elements and the like which are mounted with their faces upward are electrically connected to the several tens to several hundreds of conductive patterns 18 formed on one metal substrate 19B, through the thin metal wires 15 by simultaneous wire-bonding.

Next, as shown in FIG. 4B, the circuit elements 14 and the conductive patterns 18 are electronically connected. Here, wire-bonding to the several tens to several hundreds of conductive patterns 18 formed on one metal substrate 19B is simultaneously performed.

As shown in FIG. 5, each hybrid integrated circuit formed on the metal substrate 19B is described. FIG. 5 is a plan view of a part of the hybrid integrated circuit 17 formed on the metal substrate 19B. As a matter of fact, a larger number of hybrid integrated circuits 17 are formed. In FIG. 5, dicing lines D3 along which the metal substrate 19B is cut into the individual circuit substrates 16 are shown as dotted lines. As it can be seen in FIG. 5, the conductive patterns 18 forming an individual hybrid integrated circuit and the dicing line D3 are located extremely close to each other. This is to say that almost all the surface of the metal substrate 19B is used to form the conductive patterns 18.

In the description above, a plurality of hybrid integrated circuits are formed simultaneously on a surface of substrate 10B having a long and thin shape. When there are some restrictions on a manufacturing apparatus for die bonding and wire bonding, the metal substrate 19B can also be cut into pieces of an appropriate size in a previous step prior to this step.

<Third Step> Refer to FIGS. 6A to 7B

In this step, the individual circuit substrates 16 are separated by cutting the metal substrate 16B at the portions where the grooves 20 are formed. There may be found numerous ways to separate each circuit substrate 16, but here, ways to separate by bending and by using a cutter are described.

Figure 6A:
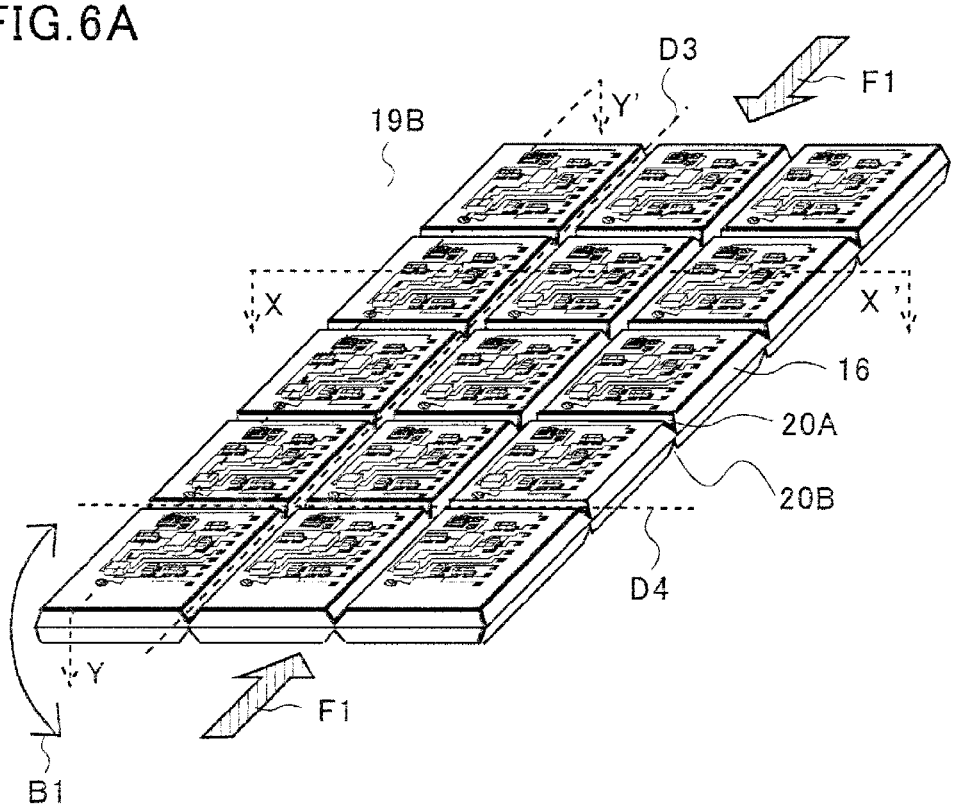
FIGS. 6A to 6C are a perspective view, a cross-sectional view, and a cross-sectional view showing the method of manufacturing the hybrid integrated circuit device of the preferred embodiment, respectively.
Figure 6B:
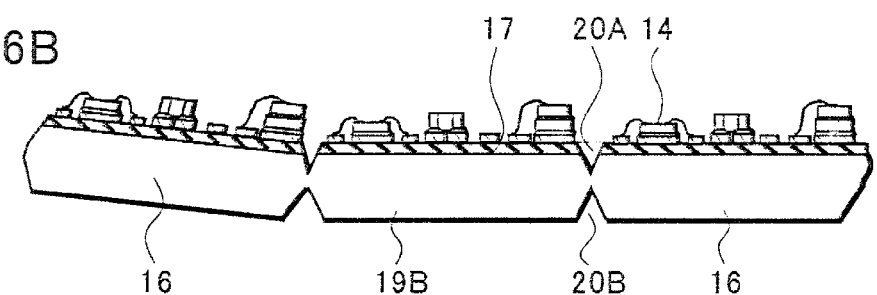
Figure 6C:
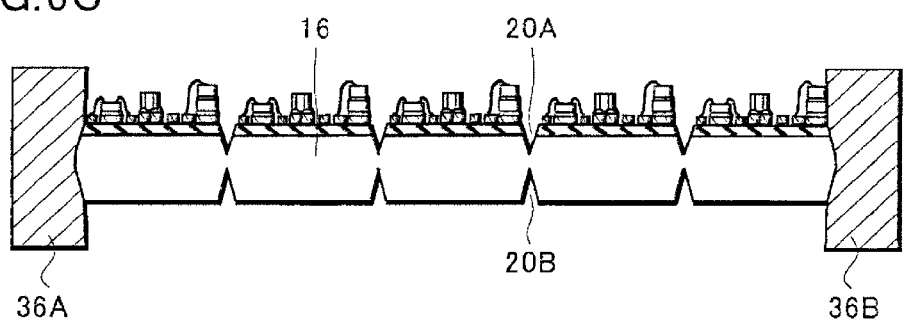

As shown in FIGS. 6A to 6C, described is a way to separate the individual circuit substrates 16 by bending the metal substrate 19B. FIG. 6A is a perspective view of the metal substrate 19B prior to the separation. FIG. 6B is a cross-sectional view taken along the X-X' line of FIG. 6A. FIG. 6C is a cross-sectional view taken along the Y-Y' line of FIG. 6A. In this way of separation, the metal substrate 19B is partially bended so that the bending occurs at the portions where the first grooves 20A and the second grooves 20B are formed. The portions where the first grooves 20A and the second grooves 20B are formed are connected with the remaining-thickness portions where the grooves 20 are not formed, and thus, by bending at these portions, separation can be easily performed at the connecting portions. When the metal substrate 19B is a substrate made of aluminum, bending is performed several times until separation is completed since aluminum is a viscous metal.

As shown in FIG. 6A, on the surface of the metal substrate 19B a plural number of electric circuits are formed in each circuit substrate 16 in a matrix configuration. Formed at boundaries of each electric circuit are the first and second grooves 20A and 20B. In this step, first, separation is performed along the cutting lines D3 and thereafter separation is performed along the cutting lines D4. In other words, the metal substrate 19B on which a plurality of hybrid integrated circuits are connected in a matrix configuration is divided in one direction, thus obtaining strip metal substrates, in each of which a plurality of circuit substrates 16 are connected in one direction. Thereafter, each strip metal substrate is divided in other direction, thus obtaining the individual circuit substrates 16. Here in this case, by performing all the divisions along the cutting lines D3, three strip metal substrates are separated. In the actual process, a larger number of circuit substrates 16 are formed. The bending of the metal substrate 19B is performed by fixedly supporting it in the direction of a fixing direction F1 shown in FIG. 6A.

With reference to FIG. 6B, the cross-sectional view taken along the line X-X' is described under the state that the separation is performed along the cutting line D3. In this separation step, the bending is performed at the boundary between the leftmost positioned circuit substrates 16 and the circuit substrates 16 adjacent to it. This bending is performed continuously in the bending direction B1 shown in FIG. 6A. Since aluminum which is a material used for the metal substrate 19B is a viscous material, separation is completed by performing bending several times.

As shown in FIG. 6C, the bending of the metal substrate 19B is performed after the side portions of the metal substrate 19B are firmly supported with fixing portions 36. In this step, the side surfaces of the circuit substrates 16 are slanted in a convex shape toward the outside. Thus, the metal substrate 19B can be supported by pressing the convex shaped side surfaces in the lateral direction at the fixing portions 36. Therefore, the fixing portions 36 will not come into contact with the surface of the metal substrate 19B, and the conductive patterns and the circuit elements 14 can be formed on all the area of the surface of the metal substrate 19B.

Figure 7A:
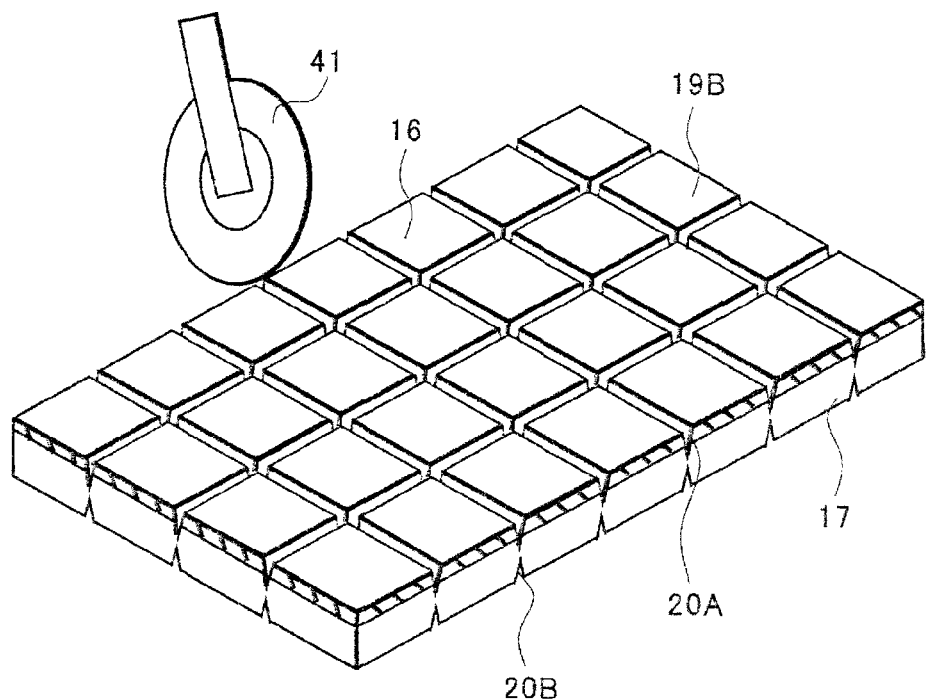
FIGS. 7A and 7B are a perspective view and a cross-sectional view showing the method of manufacturing the hybrid integrated circuit device of the preferred embodiment, respectively.
Figure 7B:
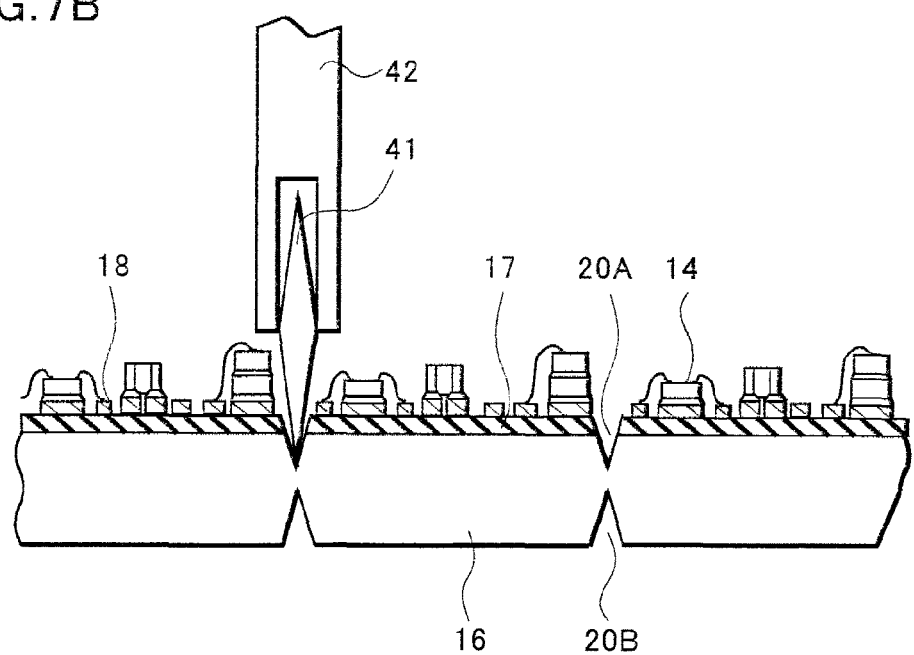

With reference to FIGS. 7A and 7B, a way to cut the metal substrate 19B by using a round cutter 41 is described. As shown in FIG. 7A, the metal substrate 19B is pressed to cut along the first grooves 20A by using the round cutter 41. Thus, the metal substrate 19B is separated into the individual circuit substrates 16. The remaining-thickness portions of the metal substrate 19B in which the grooves 20 are not formed and which are center lines of the grooves 20, are pressed to cut by the round cutter 41.

With reference to FIG. 7B, details of the round cutter 41 is described. The round cutter 41 has a round disk shape and the circumference thereof is formed in an acute angle. The center portion of the round cutter 41 is supported by a support member 42 such that the round cutter can rotate freely. The round cutter 41 does not have any driving force. In other words, the round cutter 41 rotates by moving it along the dicing line D3 with a portion of the round cutter 41 pressed to the metal substrate 19B.

Moreover, besides the ways described hereinbefore, it is also possible to consider a way to separate individual circuit substrates using a laser by removing the remaining-thickness portions of the substrate at the positions where the first and second grooves 20A and 20B are provided. Further, it is also feasible to use a cut saw rotating at a high speed to remove the remaining-thickness portions of the substrate. Furthermore, it is possible to separate each circuit substrate 16 by punching.

Figure 8:
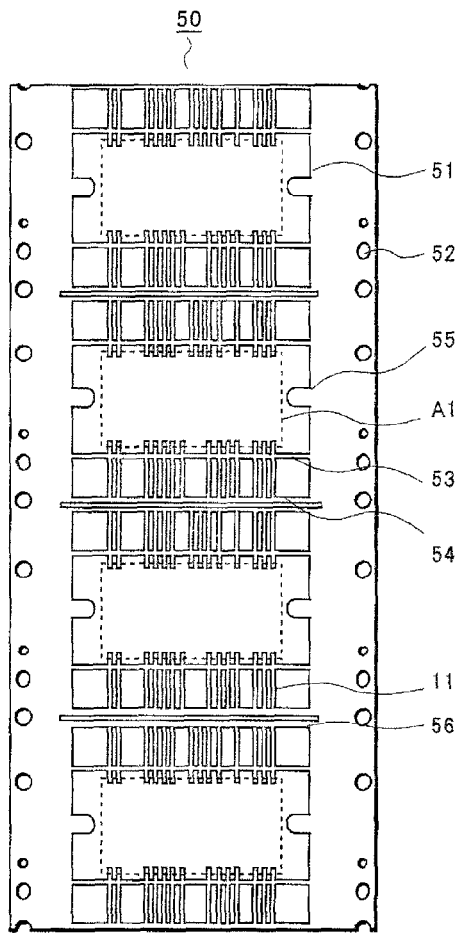
FIG. 8 is a plan view showing the method of manufacturing the hybrid integrated circuit device of the preferred embodiment.

<Fourth Step>: Refer to FIGS. 8 to 9C

In this step, the circuit substrate 16, which has been separated in the previous step, is fixed on the lead frame 50.

First, with reference to a plan view in FIG. 8, a configuration of the lead frame 50 is described. The lead frame 50 presents a shape of a strip in its contour and is obtained by processing a metal sheet of about 1 mm to 0.5 mm thickness. The processing of this metal sheet can be performed either by etching or by stamping.

In the lead frame 50, a plural number of units 51 are arranged at predetermined intervals. Here, the unit 51 can be defined as a group of leads 11 to be connected to the circuit substrate 16. Therefore, in a condition that the leads are to be connected to two opposite edge portions of the circuit substrate 16, a plurality of leads 11 are formed extending toward the center portion from the opposite edge portions of the unit 51. In the case that the leads 11 are fixed at only one side of the circuit substrate, each unit 51 constituted by leads 11 which extend from one side toward the inside.

The leads 11 of each unit 51 are connected to each other at a first connecting portion 53 and a second connecting portion 54 and the position is fixedly maintained. Further, end portions of the leads 11 extend to an area A1 where the circuit substrate 16 is planed to be allocated.

There is provided a slit 56 between each unit 51 acting as an absorber of heat stress in a heating process. The slit 56 is formed almost as long as the width of the unit 51 or even longer than that, and it possesses a shape such as a continuous opening.

Guide holes 52 are holes provided in longitudinal edge portions of the lead frame 50, and are used in positioning of the lead frame 50 in each step. Therefore, the fixing of the position of the lead frame 50 using the guide holes 52 can also indirectly facilitate positioning of the circuit substrate 16 which is to be fixed on the unit 51.

Figure 9A:
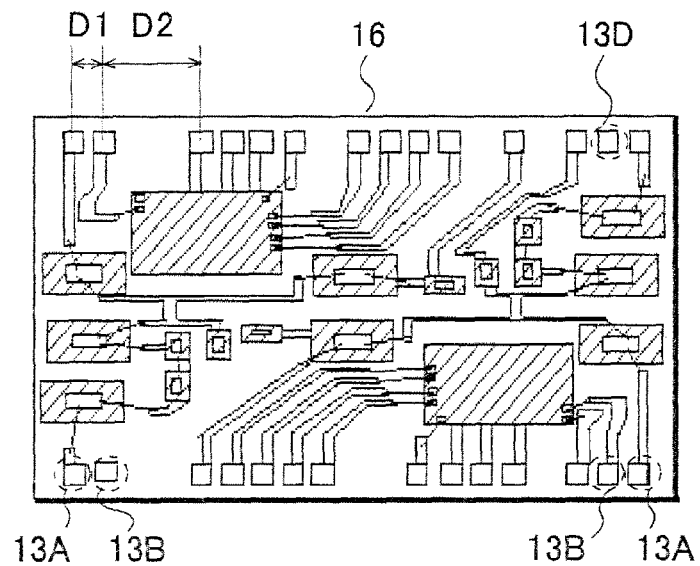
FIGS. 9A to 9C are a plan view, a plan view and a cross-sectional view showing the method of manufacturing the hybrid integrated circuit device of the preferred embodiment, respectively.
Figure 9B:
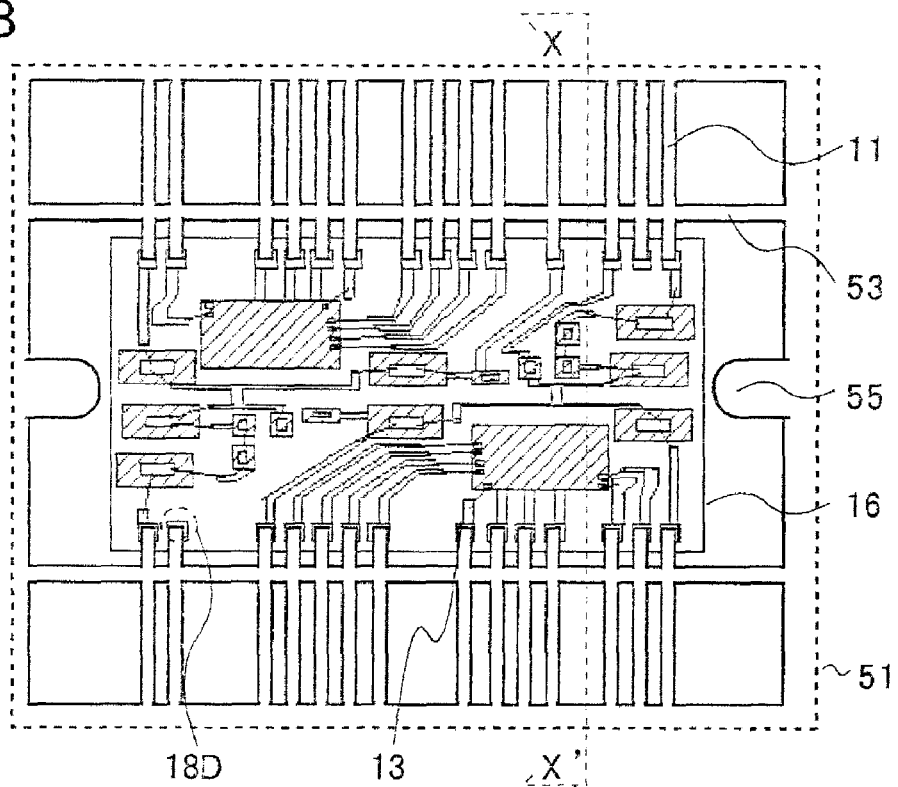
Figure 9C:
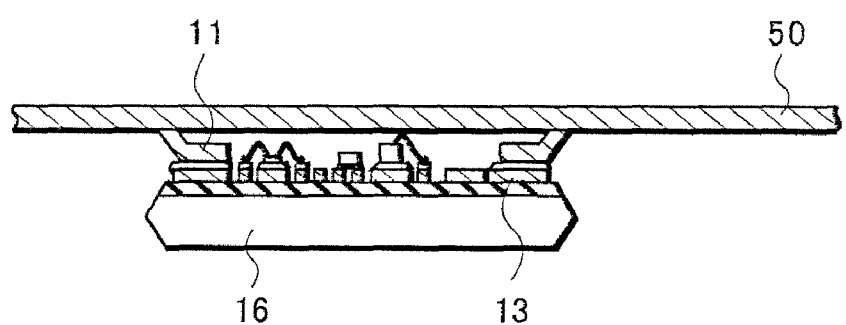

With reference to FIGS. 9A to 9C, the step of fixing the circuit substrate 16 on each unit 51 of the lead frame 50 is described in detail. FIG. 9A is a plan view showing a state of the hybrid integrated circuit device formed on the surface of the circuit substrate 16. FIG. 9B is a plan view showing a state of the circuit substrate 16 fixed on the leads 11 of the unit 51. FIG. 9C is a cross-sectional view taken along the X-X' line in FIG. 9B.

With reference to FIG. 9A, a configuration of pads 13 formed on the surface of the circuit substrate 16 is described. On the surface of the circuit substrate 16, the conductive pattern 18 is formed which is patterned to form an intended electric circuit. Thereafter, by electrically connecting the circuit elements 14 to intended portions in the conductive pattern 18, a predetermined hybrid integrated circuit is formed. Further, the pads 13 which are constituted by portions of the conductive patterns 18 are formed in the vicinities of edge portions of the circuit substrate 16. Here, the pads 13 are formed which are aligned in the vicinities of longitudinal edge portions of the circuit substrate 16 which is formed in a narrow shape.

Furthermore, since a space between adjacent pads 13 can be as narrow as about 1.5 mm, it is possible to form a plural number of pads 13 along the longitudinal direction of the circuit substrate 16. On the other hand, depending on the kind of an electrical circuit formed on the surface of the circuit substrate 16, the number of necessary input/output terminals varies. In this embodiment, if the number of the necessary input/output terminals is smaller than that of the pads 13, vacant positions are provided in the arrangement of the pads 13 as shown in FIG. 9A. In other words, basically the space between pads 13 is kept constant, and spaces between pads 13 are made wider locally. The space between the pads 13 located apart from each other as described above is represented by D2.

At the corners of the circuit substrate 16, there are provided first pads 13A which are the pads 13 located at the end edge portion. Second pads 13B are adjacent to the first pads 13A. In this embodiment, the space D1 between the first pad 13A and the second pad 13B is set almost as the same as or smaller than of the space D2 between other pads 13. Due to this arrangement, reliability in connection between the first pad 13A and the lead 11 can be improved. The details thereof are described later.

In a condition that the pad 13 is not necessitated as a connection terminal in the proximity of the first pad 13A, it may be allowed to place a dummy pad 13D. The situation is the same for the case in which there is not a pad 13 which can be a connection terminal in the proximity of the second pad 13B. Here, the dummy pad 13D means a pad 13 which is not a constituent of the electric circuit. Accordingly, the dummy pad 13D and the lead 11 are connected only mechanically. By placing a dummy pad 13D in the proximity of the first pad 13A or the second pad 13B, it is possible to make a space between pads 13 smaller. Thus, a thermal stress which is generated at a connection portion between the pad 13 and the lead 11 can be reduced.

As shown in FIGS. 9B and 9C, the pads 13 and the leads 11 are connected each other with conductive adhesive such as brazing material and the circuit substrate 16 is fixed on the lead frame 50. The number count and physical locations of the leads 11 for each unit 51 correspond to the pads 13 which are formed on the surface of the circuit substrate 16.

As described above, the merits for a smaller space allocation between the first pad 13A and the second pad 13B is described. In this embodiment, the circuit substrate 16 is made of metal mostly aluminum, and the lead frame 50 is made of metal mostly copper. Since copper and aluminum have different thermal expansion coefficients, thermal stress is generated at the joint between the lead frame 50 and the circuit substrate 16 under the condition that heat is applied while both of them are mechanically connected. In this embodiment, the thermal stress is exerted at the joint portion of the lead 11 and the circuit substrate 16. The magnitude of the thermal stress becomes greater as the space between the pads 13 increases. The thermal stress acts stronger for the pads 13 located in the periphery than for the pads 13 around the center portion of the circuit substrate 16. Therefore, in a condition that the space between the first pad 13A located at the outmost periphery and the adjacent second pad 13B becomes greater, a large amount of thermal stress will act on the joint of the first pad 13A and the lead 11.

Because of the reason described above, in this embodiment, the space between the first pad 13A and the second pad 13B is set smaller than spaces between other pads 13. As shown in FIG. 9A, the length of the distance D1 is set equal to or smaller than that of the distance D2. By doing so, it is possible to prevent that an excess stress will act on the joint of the first pad 13A and the lead 11.

Figure 10:
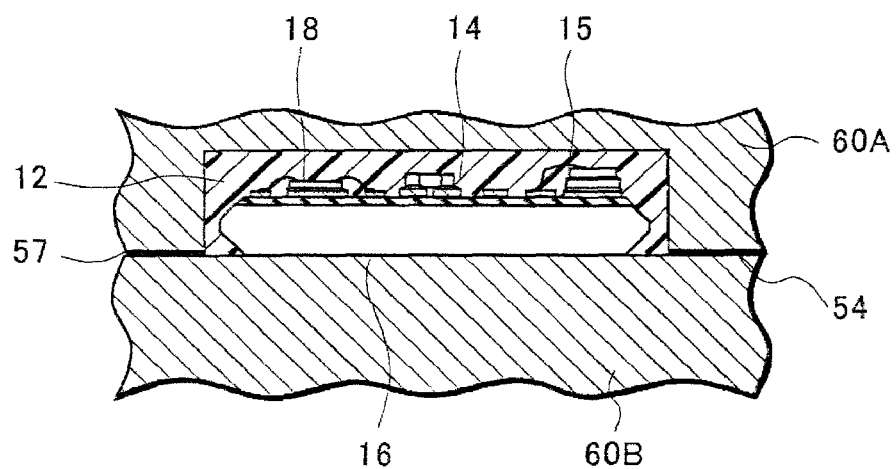
FIG. 10 is a cross-sectional view showing the method of manufacturing the hybrid integrated circuit device of the preferred embodiment.
Figure 11:
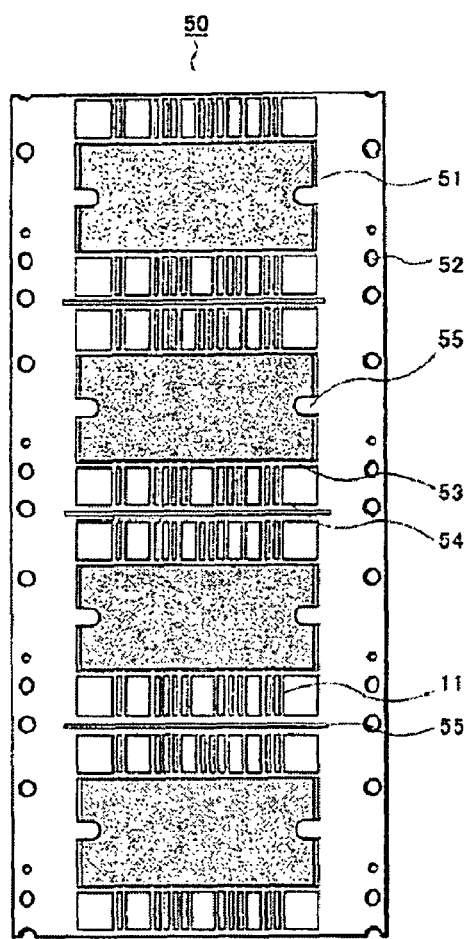
FIG. 11 is a plan view showing the method of manufacturing the hybrid integrated circuit device of the preferred embodiment.
Figure 12A:
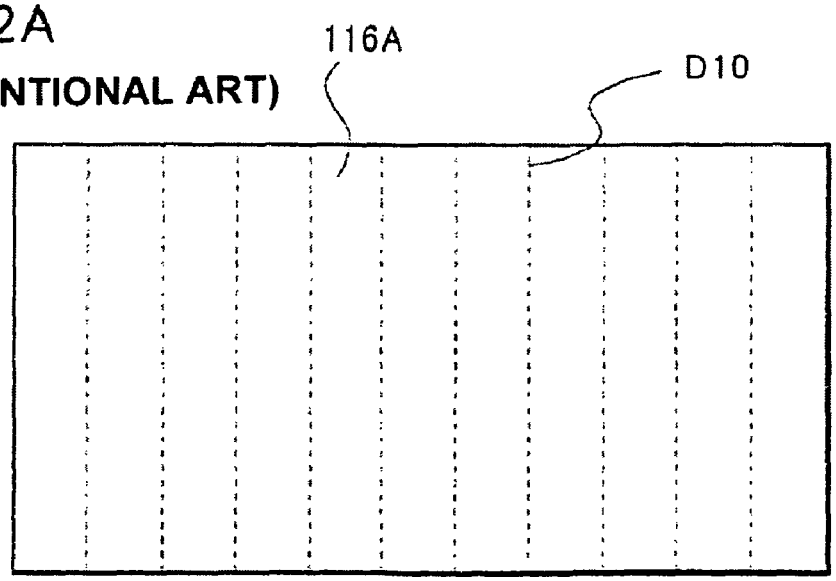
FIGS. 12A and 12B are a plan view and a cross-sectional view showing a known method of manufacturing a hybrid integrated circuit device, respectively.
Figure 12B:
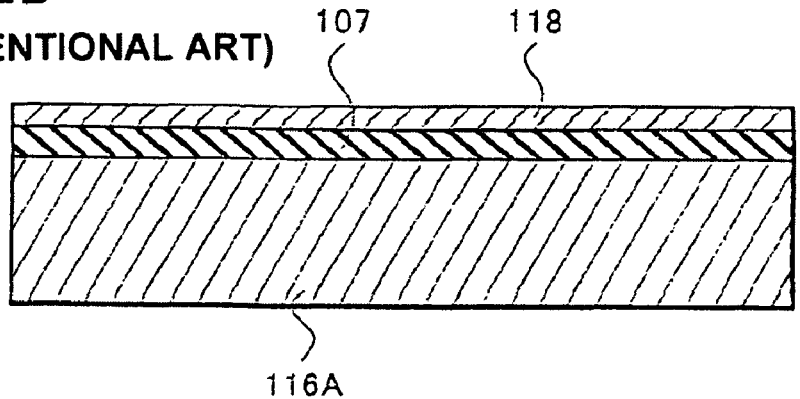
Figure 13A:
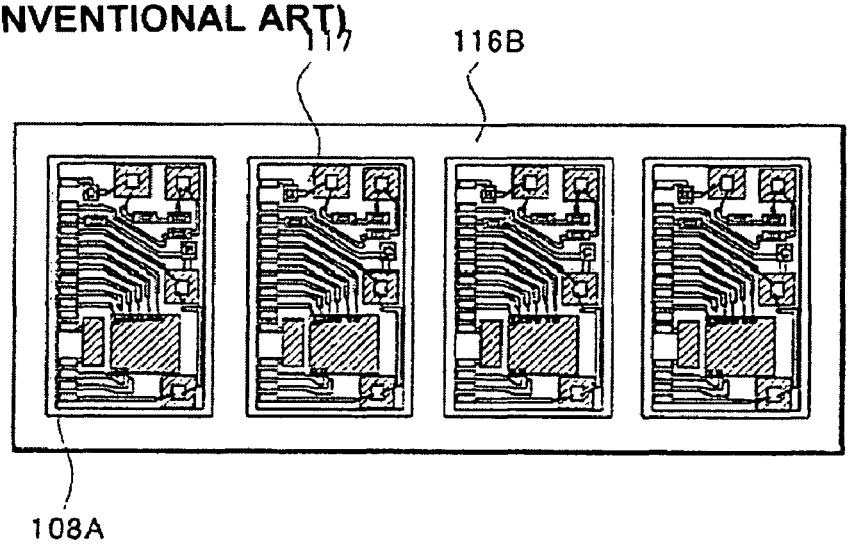
FIGS. 13A and 13B are a plan view and a cross-sectional view showing the known method of manufacturing the hybrid integrated circuit device, respectively.
Figure 13B:
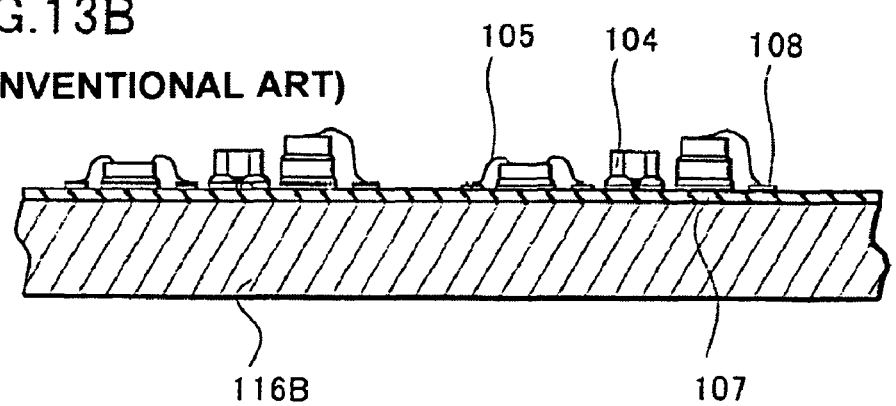
Figure 14:
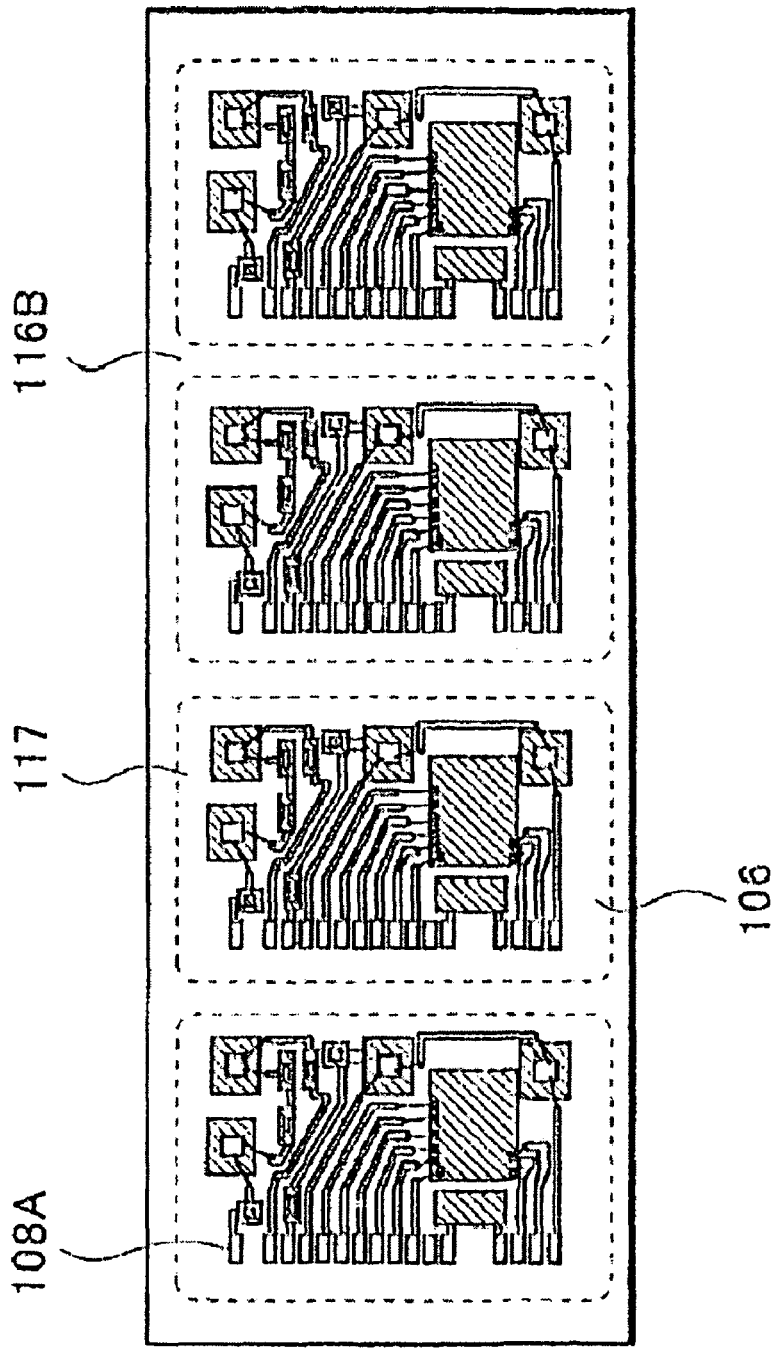
FIG. 14 is a plan view showing the known method of manufacturing the hybrid integrated circuit device.

<Fifth Step>: Refer to FIGS. 10 and 11

With reference to FIG. 10, for the step of sealing the circuit substrate 16 with the sealing resin 12 is described. FIG. 10 is a cross-sectional view showing for the step of sealing the circuit substrate 16 with the sealing resin 12 by using a molding die 50.

First, the circuit substrate 16 is placed on a lower molding die 60B. Next, the circuit substrate 16 is contained in a cavity formed by contacting an upper molding die 60A and a lower molding die 60B. Next, the sealing resin 12 is injected to the cavity through a gate 57. As to ways to perform sealing, the transfer molding using thermosetting resin or injection molding using thermoplastic resin can be adopted. The amount of gas inside the cavity which corresponds to the amount of the sealing resin 12 to be injected from the gate 57 is exhausted to the outside through an air vent 54. Note that the location of the gate and the air vent in FIG. 10 is an example and can be set arbitrarily depending on the shape and structure of the product.

In this embodiment, a plurality of circuit substrates 16 which are fixed to the lead frame can be sealed simultaneously. Thus, it is possible to simplify the step of sealing with resin. Further, as it has been described before, pads which locate at the end edges of the circuit substrate 16 are not isolated. Thus, in the step of resin sealing accompanying heating, thermal stresses that act on the pads located at the end edges can be reduced.

As has been described above, slanted portions are provided at the side surfaces of the circuit substrate 16. Therefore, by sealing with insulating resin, the sealing resin 12 flows, wrapping around the slanted portions. Because of this, an anchor effect is created between the sealing resin 12 and the slanted portions, and the bonding between the sealing resin 12 and the circuit substrate 16 is enhanced.

A plan view in FIG. 11 shows a state of the lead frame 50 after sealing with the sealing resin 12. The circuit substrates 16 which are fixed on the respective units 51 have been sealed with the sealing resin 12. The circuit substrate 16 sealed with the resin in this step is completed as a product after passing through a lead cut step, a testing step, and the like. Furthermore, the separation of each sealed circuit substrate 16 is performed after cutting the leads 11.

What is claimed is:

1. A method of manufacturing a hybrid integrated circuit device comprising:
   preparing a lead frame which is constituted by units each having a plurality of leads; and
   fixing a circuit substrate on each unit of the lead frame by fixing pads formed on a surface of the circuit substrate to the leads,
   providing the circuit substrate with a first side edge and a second side edge opposite to said first side edge, and also with a third side edge and a fourth side edge opposite to said third side edge, with said first and second side edges extending in a first direction and said third and fourth side edges extending in a second direction that is substantially perpendicular to said first direction,
   further including disposing a plurality of pads in the vicinities of and along the first side edge from the vicinity of a first end of said first side edge to the vicinity of a second end of said first side edge,
   wherein a space between a first pad of said plurality of pads which is formed at said first end of said first side edge of the circuit substrate and a second pad which is adjacent to the first pad is set narrower than a space between other pads of said plurality of pads,
   wherein a space between a third pad of said plurality of pads which is formed at said second end of said first side edge of the circuit substrate and a fourth pad which is adjacent to the third pad is set narrower than a space between said other pads,
   further including transfer molding said circuit substrates on said lead frame to perform sealing with resin,
   wherein the fixing of the leads and the pads to each other is performed with only brazing material, and
   further including said circuit substrate being surrounded around all of said first, second, third and fourth side edges by a support portion of the lead frame.

2. The method according to claim 1, wherein the plurality of pads are arranged along the same longitudinal line along said first side edge of the circuit substrate.

3. The method according to claim 1, further including providing a plurality of pads in the vicinities of and along the second side edge from a vicinity of a first end of said second side edge to a vicinity of a second end of said second side edge such that pads are arranged along at least two opposite side edges of the circuit substrate.

4. The method according to claim 1, wherein any one of the first and second pads is a dummy pad.

5. The method according to claim 1, wherein the circuit substrate is fixed on the lead frame after forming an electric circuit constituted by a conductive pattern and a circuit element on the surface of the circuit substrate.

6. The method according to claim 1, wherein an electric circuit formed on the surface of the circuit substrate is sealed after fixing the circuit substrate on the lead frames.

7. The method of claim 1, further including providing a plurality of pads in the vicinities of and along the second side edge from a vicinity of a first end of said second side edge to a vicinity of a second end of said second side edge such that pads are arranged along at least two opposite side edges of the circuit substrate,
   wherein a space between a first pad of said plurality of pads which is formed at an said first end of said second side edge of the circuit substrate and a second pad which is adjacent to the first pad formed at said first end of said second side edge is set narrower than a space between other pads of said plurality of pads along the second side edge, and
   wherein a space between a third pad of said plurality of pads which is formed at an said second end of said second side edge of the circuit substrate and a fourth pad which is adjacent to the third pad along the second side edge is set narrower than a space between said other pads along the second side edge.

8. The method of claim 7, further including integrally connecting, by a support portion of the lead frame, leads that are fixed on said pads disposed along said first side edge with leads fixed on said pads disposed along said second side edge.

9. The method of claim 1, wherein distal ends of said leads are fixed on said pads by said brazing material and proximal ends of said leads are fixed by the support portion of the lead frame such that strong thermal stresses act at joints between the leads and the pads.

10. The method of claim 1, further including fixing a plurality of said circuit substrates to said lead frame.

11. The method of claim 1, wherein said other pads along said first side edge includes a plurality of adjacent pads separated from one another an approximately equal first distance from each other, and includes at least some adjacent pads that are separated from one another a second distance that is larger than said first distance by providing a vacant position in the arrangement of pads, and wherein said space between said first pad and said second pad is set at said first distance.

* * * * *